United States Patent [19]

Gieskes

[11] Patent Number: 4,848,640
[45] Date of Patent: Jul. 18, 1989

[54] APPARATUS FOR THE APPLICATION OF A CONDUCTIVE ADHESIVE MEDIUM TO A PRINTED CIRCUIT BOARD

[75] Inventor: Koenraad A. Gieskes, Oosterhout, Netherlands

[73] Assignee: Soltec, B.V., Netherlands

[21] Appl. No.: 155,419

[22] Filed: Feb. 12, 1988

[51] Int. Cl.$^4$ ............................................. H05K 3/34
[52] U.S. Cl. .................................. 228/37; 228/180.1
[58] Field of Search .................... 228/34, 35, 37, 180.1

[56] References Cited

U.S. PATENT DOCUMENTS

| 2,529,699 | 11/1950 | Lach | 228/37 |
|---|---|---|---|
| 2,918,028 | 12/1959 | Wright | 228/35 |
| 3,084,650 | 4/1963 | Johns | 228/37 |
| 3,604,611 | 9/1971 | Lamberty | 228/180.1 |
| 3,705,457 | 12/1972 | Tardoskegyi | 228/37 |
| 4,019,671 | 4/1977 | Akyuerek | 228/180.1 |
| 4,101,066 | 7/1978 | Corsaro et al. | 228/37 |
| 4,375,271 | 3/1983 | Tsuchikura | 228/180.1 |
| 4,465,014 | 8/1984 | Bajka et al. | 228/37 |
| 4,540,114 | 9/1985 | Pachschwöll | 228/37 |
| 4,684,056 | 8/1987 | Deambrosio | 228/180.1 |

Primary Examiner—M. Jordan
Attorney, Agent, or Firm—Fidelman & Wolffe

[57] ABSTRACT

An apparatus for the application of a conductive adhesive medium in a fluid state to a side of a printed circuit board bearing electronic components is disclosed. The apparatus generally comprises a hollow shaft standing in a supply tank for the adhesive medium in an obliquely rising conveyor belt for at least one circuit board at a time. The upper end of the hollow shaft has two overflow edges arranged perpendicularly to the direction of transport for the formation of a wave, through the crest of which the side of the card previously moistened with a flux, is passed.

9 Claims, 3 Drawing Sheets

APPARATUS FOR THE APPLICATION OF A CONDUCTIVE ADHESIVE MEDIUM TO A PRINTED CIRCUIT BOARD

BACKGROUND AND SUMMARY OF THE INVENTION

This invention generally relates to an apparatus for the application of a conductive adhesive medium in a fluid state, such as solder, to the side printed with circuitry of a board bearing electronic components. The apparatus includes a hollow nozzle standing in a supply tank for the adhesive medium, and an obliquely rising conveyor belt for one circuit board at a time, wherein the upper end of the hollow nozzle possesses two overflow edges arranged perpendicular to the direction of transport for the formation of a wave, through the crest of which the side of the card, previously moistened with a flux, is passed.

A soldering apparatus is known which is provided with two nozzles, which are arranged one behind the other with respect to the direction of transport of the circuit boards to be processed. The purpose of the first nozzle is to apply the adhesive medium or solder, generally a tin alloy, to the underside of the circuit board in a sufficient quantity to ensure covering of all the areas to be soldered, while the function of the second nozzle is to remove the surplus solder.

It is already known that the apparatus can be embodied with a single soldering nozzle, with which both functions can be achieved. However, with decreasing dimensions of the areas to be soldered, it is becoming increasingly difficult to achieve 100% adhesion to all the areas using the conventional single-nozzle apparatus.

The present invention has for its aim to procure an apparatus with which a 100% coverage of the areas to be soldered is in fact achieved.

The apparatus according to the invention is distinguished in that near to the leading overflow edge with respect to the direction of transportation, an adjustable damming means is arranged for the temporary raising of the fluid level.

Owing to the damming means at the front of the nozzle, an asymmetrical, when viewed in vertical section, wave crest is achieved, which brings in train the following unexpected advantages.

1. The underside of the circuit board is guided through a heightened crest over the commencement of the nozzle, which effectuates an intensified flow of adhesive medium.

2. The quality descending rear flank of the wave-crest results in a gradual decrease in surplus material, whereby short-circuit bridges are prevented.

According to a further development of the apparatus, the invention proposes embodying the damming means in the form of a channel arranged perpendicular to the direction of transportation, the fluid adhesive medium being pumped upwards into said channel, the whole being arranged so that, together with the wave emerging from the nozzle, the asymmetrical wave pattern is achieved.

In a particular embodiment, as the pumping means, a rotatably journalled driven roller with a non-round or round but eccentric transverse cross section is arranged in the longitudinal direction of the channel.

This embodiment offers the unexpected advantage that a small extra wave, whose frequency depends on the speed of rotation of the roller, is superimposed on the crest of the asymmetrical wave. Through this an agitated waveform is brought about, which is particularly advantageous for the soldering of very small components on the underside of the circuit board, since with a smooth wave-crest surface such components are difficult to reach, on account of the high surface tension of the adhesive medium. Owing to the fact that this takes place in the leading, downflow wave part, the portion of the wave which is situated above the nozzle is hardly disturbed, whereby the smooth surface which is necessary for the gradual decrease in the surplus adhesive medium is maintained.

The foregoing and other objects, features and advantages of this invention will be apparent from the following, more particular, description of the preferred embodiments of this invention, as illustrated in the accompanying drawings.

DETAILED DESCRIPTION OF THE INVENTION

In the sundry figures identical components are indicated with the same reference numbers.

Figure 1:
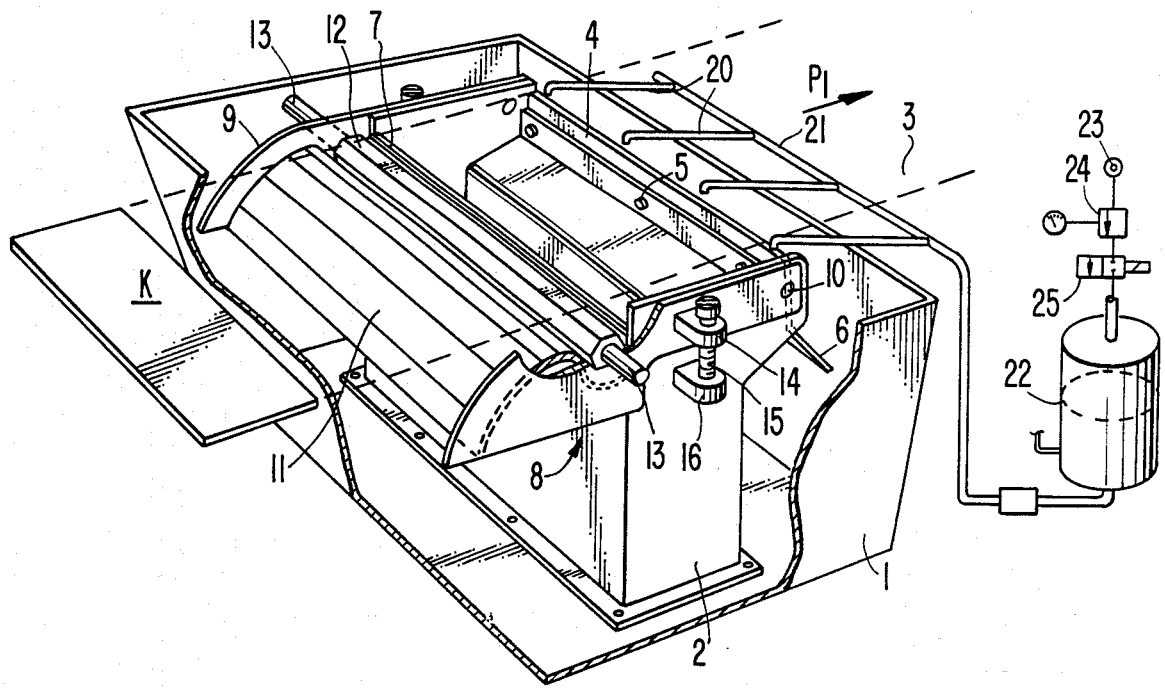
FIG. 1 shows a perspective top view of a part of the apparatus which comprises the shaft in which adhesive medium is forced up.

The apparatus shown in FIG. 1 consists substantially of a tank 1, in which a nozzle 2 is placed, such that the adhesive medium emerging from the nozzle is collected in tank 1. This per se known construction is housed in a soldering apparatus which is provided with a conveyor belt 3, along which the circuit boards K to be treated are conducted above nozzle 2. The conveyor belt passes moreover along a station for the application of a flux, and also a drying station, both being arranged before nozzle 2 in the direction of transportation. These components are regarded as known and fall further outside the scope of the invention.

Nozzle 2 consists substantially of a tower with a rectangular cross section, which is widened at the top end when viewed in relation to the direction of transportation P1. Along the trailing edge of the tower is arranged a plate-like strip part which is fastened to the rear wall of the tower by means of screws 5, said strip part being extended downward in an apron part 6. The upper edge of strip part 4 forms a trailing overflow edge which extends perpendicular to the direction of transportation P1.

On the leading side of nozzle 2 with respect to the direction of transportation P1 there is arranged a U-shaped channel 7, forming a part of a structure 8 which is fixed or optionally hingeable with respect to the nozzle. The hingeable structure consists of two upright wall parts 9, which are pivotably coupled at 10 to the side wall of nozzle 2. Between the side plates 9 a curved downflow plate 11 is arranged, which forms the leading overflow edge of channel 7. Finally, roller 12 is journalled in side plates 9, the roller being provided with bearing stubs 13 which are driven by driving means not shown.

Side plates 9 also have a lug 14, in which a threaded hole is located for accommodating a lead screw 15, which rests on a lug 16 on the side of nozzle 2. By rotation of lead screw 15, the distance between lugs 14, 16 can be increased or decreased, so that plates 9 can hinge up and down around the pivot point 10, whereby the height of channel 7 and the thereto attached overflow plate 11 becomes adjustable in height with respect to nozzle 2.

Finally it should be mentioned that a main pump 17 is arranged, in the known way, for the circulation of a conductive adhesive medium from tank 1 to nozzle 2 and vice versa, by which means a wave can be realized at the top of nozzle 2.

The surface of the wave is determined by the respective height of overflow edge 4 or of edge 18 between channel 7 and plate 11. The height is adjustable in the correct manner by means of overflow edge 4 and adjuster screws 15, or, respectively, by altering the throughput of main pump 17.

In this way there results a wave pattern with a symmetrical character by the conventional method, the wave crest lying approximately above the center of nozzle 2.

Figure 2:
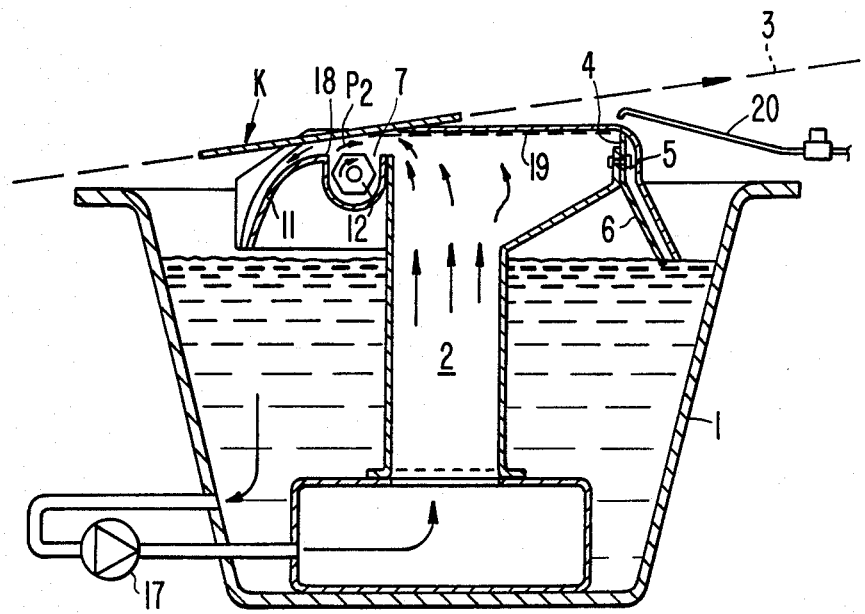
FIG. 2 shows a schematic vertical cross-section of the apparatus of FIG. 1.

According to the invention, however, a pump means is driven in channel 7, said pump here taking the form of rolling body 12, which in transverse cross section displays a non-round or eccentric shape, for example a hexagon in FIG. 2. The rolling body is driven in the direction of arrow P2 by the driving of axle stubs 13, whereby in the channel a circulation of fluid adhesive medium comes about in the direction of arrow P2. This causes a surge of fluid adhesive medium above channel 7, so that the crest of the wave becomes displaced to a position above channel 7. This results in a asymmetric wave, such that during passage of a circuit board K along conveyor belt 3 (see FIG. 2) the crest of the wave can vigorously inundate the underside of the circuit board. Owing to the fact that the distance between the leading overflow edge of strip 4 and channel 7 is enlarged, the surface of the rearward flank of the wave becomes gradually lower, which brings about the desired striking-off effect.

Owing to the non-round or eccentric cross section of rolling body 12, the part of the wave above channel 7 is also brought into vigorous turbulence, whereby the surface acquires an extra superimposed wave which yet further improves the vigorous inundation of the underside of circuit board K.

As soon as circuit board K has passed, the drive to the rolling body 12 may be stopped, whereby the wave surface drops to beneath the broken line 19 and the wave pattern consequently becomes symmetrical again.

On the other hand, it is possible to arrange the overflow edge of strip 4 at such a height that adhesive medium flows away only over channel 7.

This makes possible the option of protecting the surface against oxidation by supplying an insulating fluid material by means of nozzle pieces 20. By correct positioning of nozzles 20 over the surface above nozzle 2, the fluid insulating material can be released on the most suitable places on adhesive medium to obtain a maximal protection against oxidation.

Nozzle pieces 20 fed by a common supply line 21, which stands in connection with a supply tank 22. Supply tank 22 is linked to a pressure source 23, which is joined via a pressure regulator 24 and an electric valve 25.

Electric valve 25 is incorporated in the same control circuit as the drive motor of main pump 17, such that on starting up of main pump 17 valve 25 is actuated and liquid insulating material is spread via nozzle pieces 20 onto the surface of the adhesive medium in nozzle 2.

Figure 3A:
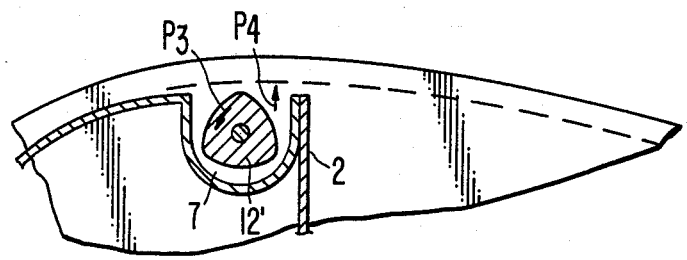
FIGS. 3a, b and c each show a vertical cross section corresponding to FIG. 2 of an alternative embodiment of a rotatable impeller, in the outflow part of the nozzle.
Figure 3B:
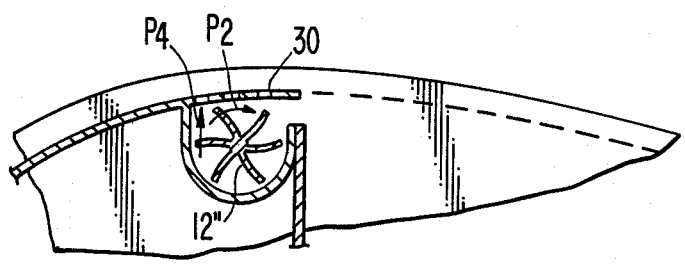
Figure 3C:
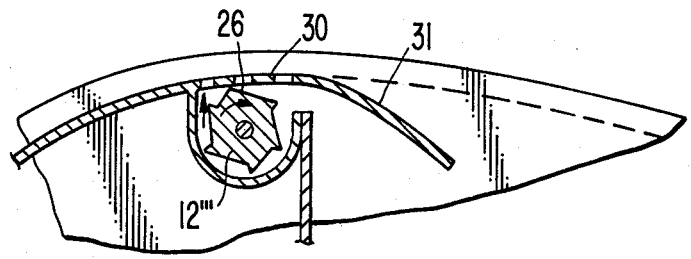

FIGS. 3a to 3c illustrate variant embodiments of roller body 12. Thus FIG. 3a shows a roller body 12' with a substantially triangular transverse cross section, which is caused to rotate in the direction of arrow P3, that is to say, in the opposite sense to arrow P2 in FIG. 2, in a similar semicircular channel. The surge of medium now takes place just in front of the leading edge of nozzle 2, which may be desired in some embodiments.

FIG. 3b shows a rolling body 12" in the form of a fan, which is driven in the direction of arrow P2 and causes a surge as indicated by arrow P4.

FIG. 3c shows a rolling body 12" which is made with tooth-like projections 26 in the axial direction, which make the surge and/or the extra superimposed wave more vigorous.

FIGS. 3b and 3c further show a plate 30 which is perforated with a suitable pattern and openings or aperatures having forms or configurations for evenly distributing the flow of solder over the width of the channel and to ameliorate the even raising of the liquid level. For an undisturbed inflow of liquid into the channel, the plate 30 may be provided with an extension 31 which reaches into the hollow shaft 2 for guiding the raised fluid.

Figure 4:
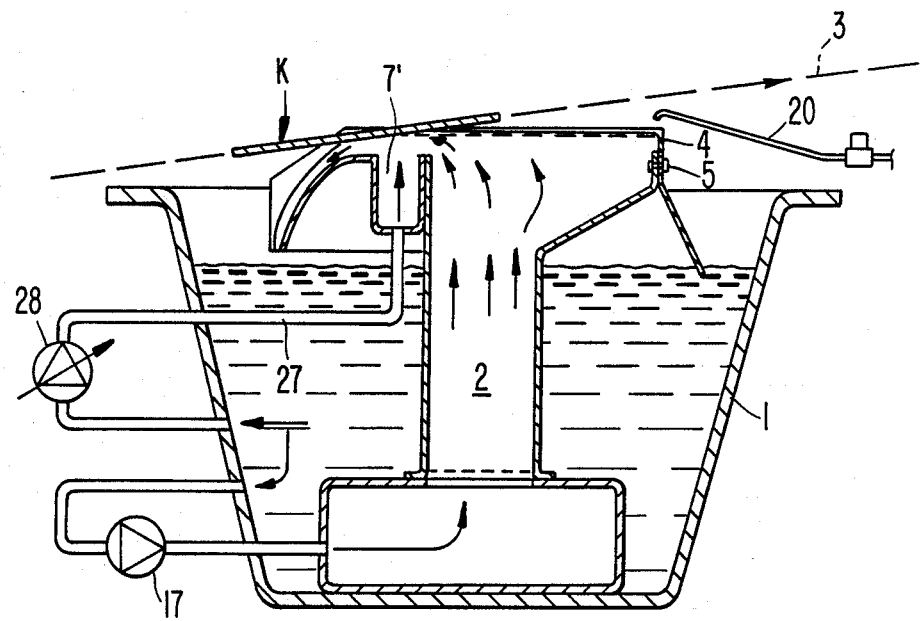
FIG. 4 shows a vertical cross section of a fifth embodiment, corresponding to FIG. 2.

FIG. 4 shows an embodiment in which the semi-circular channel is replaced by a rectangular cross-section U-shaped channel 7'. On the underside of the channel there discharges a supply line 27, which is fed by an adjustable pump 28. The pump receives fluid adhesive medium from tank 1 and ensures that during operation of main pump 17 extra medium is caused to surge into channel 7', so that a raising of the level and the asymmetric wave pattern are obtained. By splitting supply line 27 into a plurality of supply lines which are distributed over the length of channel 7', an irregular superimposed wave on the crest of the main wave can be obtained here too. For the rest, the operation of the apparatus according to FIG. 4 is the same as the embodiments described above.

While the invention has been particularly shown and described in reference to preferred embodiments thereof, it will be understood by those skilled in the art that changes in form and details may be made therein without departing from the spirit and scope of the invention.

What is claimed is:

1. An apparatus for the application of a conductive adhesive medium in a fluid state, such as solder, to the side printed with circuitry of a board bearing electronic components, said apparatus comprising a hollow nozzle standing in a supply tank for the adhesive medium, and an obliquely rising conveyor belt for one circuit board at a time, wherein the upper end of the hollow nozzle possesses two overflow edges arranged perpendicular to the direction of transportation for the formation of a wave, through the crest of which the side of the circuit board, previously moistened with a flux, is passed, wherein close to the leading overflow edge with respect to the transportation direction, an adjustable damming means is arranged for the temporary raising of the fluid level such that the crest of the wave is shifted from above the nozzle toward said leading overflow edge, said damming means comprising a channel arranged perpendicular to the direction of transportation and means for pumping the fluid adhesive medium upwards out of the channel.

2. An apparatus as claimed in claim 1, wherein the channel is arranged on the outside of the nozzle.

3. An apparatus as claimed in claim 1, further comprising a guiding perforated plate arranged above the channel.

4. An apparatus as claimed in claim 3, wherein the plate has an extension which reaches into the hollow shaft.

5. An apparatus as claimed in claim 1, further comprising a means for supplying an insulating fluid material onto the wave surface, and wherein at least one nozzle piece is connected to the supply means in order to deposit the material locally on the surface.

6. An apparatus for the application of a conductive adhesive medium in a fluid state, such as solder, to the side printed with circuitry of a board being electronic components, said apparatus comprising a hollow nozzle standing in a supply tank for the adhesive medium, and an obliquely rising conveyor belt for one circuit board at a time, wherein the upper end of the hollow nozzle possesses two overflow edges arranged perpendicular to the direction of transportation for the formation of a wave, through the crest of which the side of the circuit board, previously moistened with a flux, is passed, wherein close to the leading overflow edge with respect to the transportation direction, an adjustable damming means is arranged for the temporary raising of the fluid level such that the crest of the wave is shifted from above the nozzle toward said leading overflow edge, said damming means comprising a channel arranged perpendicular to the direction of transportation and means for pumping the fluid adhesive medium upwards out of the channel, said channel being adjustable in height with respect to the nozzle.

7. An apparatus for the application of a conductive adhesive medium in a fluid state, such as solder, to the side printed with circuitry of a board bearing electronic components, said apparatus comprising a hollow nozzle standing in a supply tank for the adhesive medium, and an obliquely rising conveyor belt for one circuit board at a time, wherein the upper end of the hollow nozzle possesses two overflow edges arranged perpendicular to the direction of transportation for the formation of a wave, through the crest of which the side of the circuit board, previously moistened with a flux, is passed, wherein close to the leading overflow edge with respect to the transportation direction, an adjustable damming means is arranged for the temporary raising of the fluid level such that the crest of the wave is shifted from above the nozle toward said leading overflow edge, said damming means comprising a channel arranged perpendicular to the direction of transportation and defining a portion of a circle in cross section and means for pumping the fluid adhesive medium upwards out of the channel comprising a rolling body, rotatably journalled in the longitudinal direction of the channel and driven, with a non-round transverse section.

8. An apparatus as claimed in claim 7, wherein the transverse section is a hexagon.

9. An apparatus as claimed in claim 7, wherein the transverse section is an eccentric.

* * * * *